United States Patent
Zhang et al.

(10) Patent No.: US 11,761,996 B2
(45) Date of Patent: Sep. 19, 2023

(54) POWER SUPPLY VOLTAGE DETECTOR, POWER SUPPLY VOLTAGE DETECTION APPARATUS, SYSTEM AND MEDIUM

(71) Applicant: Lemon Inc., Grand Cayman (KY)

(72) Inventors: Junmou Zhang, Los Angeles, CA (US); Dongrong Zhang, Beijing (CN); Shan Lu, Los Angeles, CA (US); Jian Wang, Beijing (CN)

(73) Assignee: Lemon Inc., Grand Cayman (KY)

( * ) Notice: Subject to any disclaimer, the term of this patent is extended or adjusted under 35 U.S.C. 154(b) by 0 days.

(21) Appl. No.: 17/732,824

(22) Filed: Apr. 29, 2022

(65) Prior Publication Data
US 2022/0357377 A1  Nov. 10, 2022

(30) Foreign Application Priority Data

Apr. 30, 2021 (CN) .......................... 202110480175.7

(51) Int. Cl.
| | |
|---|---|
| G01R 19/25 | (2006.01) |
| H03K 3/037 | (2006.01) |
| G05F 1/10 | (2006.01) |

(52) U.S. Cl.
CPC .......... *G01R 19/2513* (2013.01); *G05F 1/10* (2013.01); *H03K 3/037* (2013.01)

(58) Field of Classification Search
CPC ...... G01R 19/2513; G05F 1/10; H03K 3/037; G11C 16/0483; G11C 16/26;
(Continued)

(56) References Cited

U.S. PATENT DOCUMENTS

| | | | |
|---|---|---|---|
| 10,784,874 B1 | 9/2020 | Bang et al. | |
| 11,418,174 B2 * | 8/2022 | Hess | G11C 19/184 |

(Continued)

FOREIGN PATENT DOCUMENTS

| | | |
|---|---|---|
| CN | 104136928 A | 11/2014 |
| TW | 202008717 A | 2/2020 |

OTHER PUBLICATIONS

Nagata, M., "A Built-in Technique for Probing Power Supply and Ground Noise Distribution Within Large-Scale Digital Integrated Circuits," IEEE Journal of Solid-State Circuits, vol. 40, No. 4, Apr. 2005.

(Continued)

*Primary Examiner* — John W Poos
*Assistant Examiner* — Tyler J Pereny
(74) *Attorney, Agent, or Firm* — Faegre Drinker Biddle & Reath LLP

(57) ABSTRACT

The application provides an apparatus, a system, a detector and a detection method for power supply voltage detection. The apparatus connected to an integrated circuit power supply network comprises: a power supply voltage detector, comprising: N buffers, wherein an input terminal of a first buffer is connected to a clock signal, and output terminals of other buffers are connected to the input terminal of an adjacent buffer; N latch chains, each of which comprises M latches, wherein a clock input terminal of each latch is connected to a clock signal, a D terminal of a first latch of each latch chain is connected to the output terminal of a corresponding buffer, and Q terminals of other latches are connected to the D terminal of an adjacent latch, wherein M and N are positive integers, the VDD terminal of each latch is connected to an area in an integrated circuit power supply network where a power supply voltage is to be detected, and a grounding terminal of each latch is connected to a ground;

(Continued)

and a voltage regulation module connected to the Q terminal of each latch and configured to detect data output of each latch to determine a magnitude of a power supply voltage.

13 Claims, 10 Drawing Sheets

(58) Field of Classification Search
CPC . G11C 11/5628; G11C 11/5642; G11C 16/08; G11C 16/10; G11C 16/3459; G11C 16/3454; G11C 2211/5621; G11C 2211/5634; G11C 2211/5642; G11C 2216/14; G11C 16/30; G11C 16/32; G11C 16/3418; G11C 16/06; G11C 16/28; G11C 16/3413; G11C 16/3463; G11C 16/3481; G11C 27/00; G11C 7/1039; G11C 7/12; G11C 11/5621; G11C 11/115635; G11C 16/04; G11C 16/0491; G11C 16/102; G11C 16/14; G11C 16/16; G11C 16/24; G11C 16/3431; G11C 16/3436; G11C 16/3445; G11C 17/18; G11C 2029/5004; G11C 29/02; G11C 29/04; G11C 29/14; G11C 29/50; G11C 7/1051; G11C 7/1057; G11C 8/10; G11C 8/12; G06F 21/75; G06F 21/755; G06F 1/10; G06F 11/1068; G06F 21/554; G06F 2221/2143; G06F 3/0688; G06F 1/04; G06F 11/0793; G06F 12/0207; G06F 12/0246; G06F 12/0868; G06F 2212/1016; G06F 2212/1024; G06F 2212/202; G06F 2212/281; G06F 2212/313; G06F 2212/7203

See application file for complete search history.

(56) References Cited

U.S. PATENT DOCUMENTS

| | | | |
|---|---|---|---|
| 2010/0235125 A1* | 9/2010 | Hata | G01R 31/3016 |
| | | | 702/82 |
| 2014/0035426 A1 | 12/2014 | Turullols | |
| 2017/0030138 A1 | 10/2017 | Seomun et al. | |
| 2020/0072885 A1* | 3/2020 | Jain | H03K 3/037 |
| 2021/0064257 A1* | 3/2021 | Cariello | G06F 3/0617 |

OTHER PUBLICATIONS

Bang, S., et al, "An All-Digital, VMAX-Compliant, and Stable Distributed Charge Injection Scheme for Fast Mitigation of Voltage Droop," IEEE Solid-State Circuits Letters, vol. 2, No. 9, Sep. 2019.

* cited by examiner

Integrated Circuit Chip 100

Intellectual Property Core 11
- Power Supply Voltage Detection Apparatus 101
- Power Supply Voltage Detection Apparatus 104

Intellectual Property Core 12
- Power Supply Voltage Detection Apparatus 102
- Power Supply Voltage Detection Apparatus 103
- Power Supply Voltage Detection Apparatus 105
- Power Supply Voltage Detection Apparatus 106

Customized Circuit 13
- Power Supply Voltage Detection Apparatus 107
- ......
- Power Supply Voltage Detection Apparatus X

Provide a power supply voltage detector, comprising:
a buffer string, comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; N latch chains, each of which comprises M latches, a clock input terminal of each latch is connected to a clock signal, a data input terminal of a first latch of each latch chain is connected to the output terminal of a corresponding buffer among the N buffers, a data output terminal of the first latch is connected to the data input terminal of the second latch, the data output terminal of an $m^{th}$ latch is connected to the data input terminal of an $(m+1)^{th}$ latch, wherein M and m are positive integers, m is greater than 1 and less than M, the data input terminal of each latch is connected to an area in an integrated circuit power supply network where a power supply voltage is to be detected, and a grounding terminal of each latch is connected to a ground

502

Detect data output of each latch to determine a magnitude of a power supply voltage of the area in the integrated circuit power supply network where the power supply voltage is to be detected

FIG. 5

POWER SUPPLY VOLTAGE DETECTOR, POWER SUPPLY VOLTAGE DETECTION APPARATUS, SYSTEM AND MEDIUM

CROSS-REFERENCES TO RELATED APPLICATIONS

The present application claims the priority of the Chinese patent application No. 202110480175.7, filed on Apr. 30, 2021, for all purposes, the disclosure of which is incorporated herein by reference in its entirety as part of the present application.

TECHNICAL FIELD

The application relates to the field of integrated circuits, and more particularly, relates to a power supply voltage detector, a power supply voltage detection apparatus, a system and a computer readable medium.

BACKGROUND

As for an integrated circuit, its operation requires an external voltage source to supply power through voltage pins, and the external voltage source is connected to different latch circuits through a power supply network inside the integrated circuit. For integrated circuits manufactured through the process with 55 nm and below, generally, hundreds of millions of latch circuits are integrated. When a large number of latch circuits in one area of the integrated circuit are turned over at the same time or their operation frequencies are increasing, i.e., a load in this area increases, the power supply voltage in this area may drop and may be lower than expected. In addition, when the integrated circuit is disturbed by power supply noises, its power supply voltage will fluctuate.

Voltage sag is a term meaning a drop of voltage from a desired voltage level when a power supply drives a load. In an integrated circuit, when the load suddenly increases very rapidly, an output voltage may drop. For example, a transient load condition may occur, resulting in voltage sag. If the voltage sags too much, circuit failure will occur.

Therefore, it is necessary to detect the power supply voltage inside the integrated circuit in real time, and send an early warning signal in time when the voltage is lower than expected, to remind a voltage regulation module to regulate the voltage. Of course, there is also a need to regulate the voltage when the voltage is higher than expected.

SUMMARY

According to one or more embodiments of the present disclosure, it is provided a power supply voltage detection apparatus connected to an integrated circuit power supply network, comprising: a power supply voltage detector comprising a buffer string comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; N latch chains, each of which comprises M latches, a clock input terminal of each latch is connected to a clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area in an integrated circuit power supply network where a power supply voltage is to be detected, and a grounding terminal of each latch is connected to a ground; and a voltage regulation module connected to the data output terminal of each latch of each latch chain and configured to detect data output of each latch to determine a magnitude of a power supply voltage of the area in the integrated circuit power supply network where the power supply voltage is to be detected.

According to one or more embodiments of the present disclosure, it is provided a power supply voltage detection system, which comprises: a plurality of power supply voltage detection apparatuses according to embodiments of the present disclosure connected to a plurality of areas of an integrated circuit power supply network.

According to one or more embodiments of the present disclosure, it is provided a power supply voltage detector, which comprises: a buffer string comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; N latch chains, each of which comprises M latches, a clock input terminal of each latch is connected to a clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area where the power supply voltage is to be detected in an integrated circuit power supply network, and a grounding terminal of each latch is connected to a ground.

According to one or more embodiments of the present disclosure, it is provided a power supply voltage detection method, which comprises the following steps: providing a power supply voltage detector, which comprises a buffer string comprising N buffers, wherein an input terminal of a first buffer is connected to a clock signal, an output terminal of the first buffer is connected to an input terminal of a second buffer, and an output terminal of an nt buffer is connected to an input terminal of an $(n+1)^{th}$ buffer, where N and n are positive integers, and n is greater than 1 and less than N; N latch chains, each of which comprises M latches, wherein a clock input terminal of each latch is connected to a clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area where the power supply voltage is to be detected in an integrated circuit power supply network, and a grounding terminal of each latch is connected to a ground; and detecting data output of each latch to determine a magnitude of a power supply voltage of the area in the integrated circuit power supply network where the power supply voltage is to be detected.

According to one or more embodiments of the present disclosure, it is provided a computer readable medium, on which a computer program is stored, wherein the program, when executed by a processor, implements the power supply voltage detection method of the present disclosure.

The advantages of the technical scheme of the application over the prior art comprise but are not limited to:

1. Compared with using a digital-to-analog conversion circuit, resistors or capacitors, this structure uses a pure digital structure, which can be realized by using devices in a standard cell library, and can be directly synthesized, which is very friendly to an integrated circuit design process.

2. This structure has a high response frequency and can output a voltage detection result every clock cycle.

3. This structure has high detection accuracy, and voltage change detection accuracy of about 6 mV can be achieved at a working frequency of 1.5 GHz.

4. This structure can be adapted to different working frequencies, and no additional time delay regulation circuit is needed.

5. This structure only needs a small area overhead, and has little influence on the original integrated circuit design.

6. In this structure, all the latch circuits and other latch circuits nearby are connected to the same power supply network instead of an ideal power supply, so it is easy for them to be integrated at a back end of the integrated circuit.

BRIEF DESCRIPTION OF THE DRAWINGS

In order to more clearly explain the embodiments of the present disclosure or the technical schemes in the prior art, the following will briefly introduce the accompanying drawings needed in the description of the embodiments or the prior art. Obviously, the accompanying drawings in the following description are only some embodiments of the present disclosure. For those of ordinary skill in the art, other drawings may be obtained according to these drawings without any creative efforts.

FIG. 1 shows a block diagram of a power supply voltage detection system according to an embodiment of the present disclosure;

FIG. 5 shows a flowchart of a power supply voltage detection method according to an embodiment of the present disclosure;

DETAILED DESCRIPTION

Reference will now be made in detail to specific embodiments of the present disclosure, examples of which are illustrated in the accompanying drawings. Although the present disclosure will be described with specific embodiments, it will be understood that it is not intended to limit the present disclosure to the described embodiments. On the contrary, it is intended to cover changes, modifications and equivalents within the spirit and scope of the present disclosure as defined by the appended claims. It should be noted that the methods and steps described herein may be implemented by any functional block or functional arrangement, and any functional block or functional arrangement may be implemented as a physical entity or a logical entity, or a combination of both.

FIG. 1 shows a block diagram of a power supply voltage detection system according to an embodiment of the present disclosure. The power supply voltage detection system comprises power supply voltage detection apparatuses 101, 102, . . . , and X connected to a plurality of areas of a power supply network of an integrated circuit chip 100.

The power supply voltage detection apparatuses 101, 102, . . . , X connected to a plurality of areas may be distributed in different areas of the power supply network inside the integrated circuit chip 100, and can detect voltage fluctuations of each area in real time. These areas may comprise different areas in Intellectual Property cores (IP cores) (11, 12) and a customized circuit 13, etc. Generally speaking, if the IP core is relatively large, then the area that often operates is more susceptible to the interference of power supply noises, and the power supply voltage detection apparatus may be connected to this area. Or the areas where the power supply voltage detection apparatuses are distributed may be known by simulation in advance. Through simulation, it may be learned about which areas have high workload and may lead to a large voltage drop, then the power supply voltage detection apparatuses may be connected to these areas.

Figure 2:
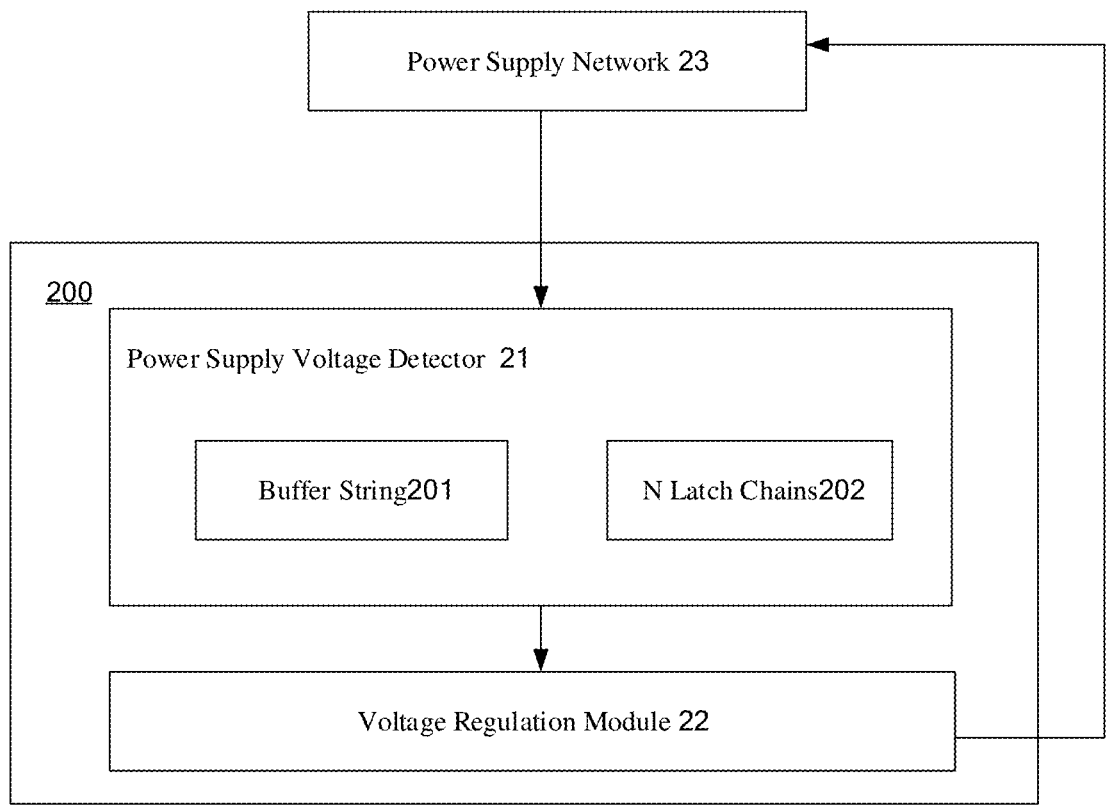
FIG. 2 shows a block diagram of a power supply voltage detection apparatus according to an embodiment of the present disclosure.

FIG. 2 shows a block diagram of a power supply voltage detection apparatus 200 according to an embodiment of the present disclosure.

The power supply detection apparatus 200 is connected to an integrated circuit power supply network 23, and comprises: a power supply voltage detector 21 and a voltage regulation module 22.

The power supply voltage detector 21 comprises a buffer string 201 comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; N latch chains 202, each of which comprises M latches, a clock input terminal of each latch is connected to the clock signal, a data input terminal of a first latch of each latch chain is connected to the output terminal of a corresponding buffer among the N buffers, the data output terminal of the first latch is connected to the data input terminal of a second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area in an integrated circuit power supply network where a power supply voltage is to be detected 23, and a ground terminal of each latch is connected to the ground.

The voltage regulation module 22 is connected to the data output terminal of each latch of each latch chain, and is configured to detect data output of each latch to determine a magnitude of a power supply voltage of the area in the integrated circuit power supply network where the power supply voltage is to be detected 23.

The structure of the power supply voltage detector 21 mainly adopts a digital circuit device such as a latch to implement indirect measurement on the power supply voltage of the integrated circuit. A latch is a level-sensitive memory unit circuit. When the latch is enabled by a trigger level, the output voltage will change with the change of the input voltage. When an enable signal ends, the latch will store the signal during the enabling until the next enabling. The time delay from the data input terminal (D terminal) to the data output terminal (Q terminal) of the latch is also affected by the power supply voltage.

Figure 3:
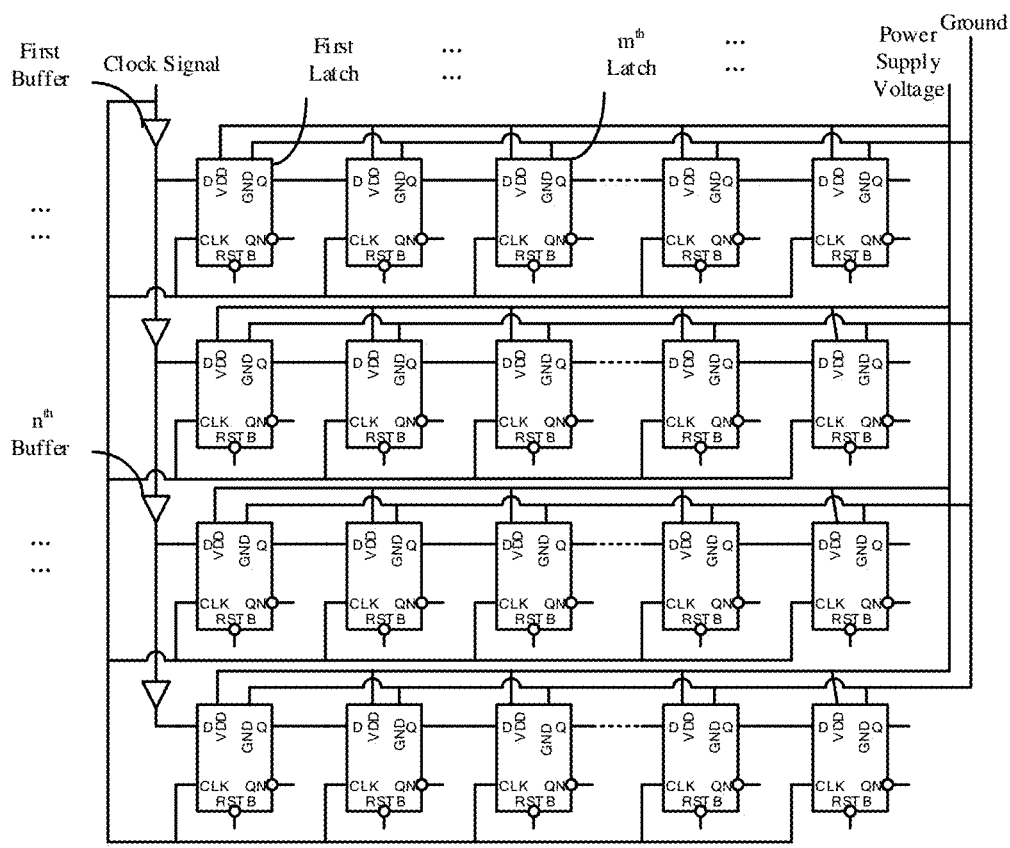
FIG. 3 shows a schematic diagram of a structure of a power supply voltage detector according to an embodiment of the present disclosure.

FIG. 3 shows a schematic diagram of a structure of a power supply voltage detector 21 according to an embodiment of the present disclosure.

As shown in FIG. 3, the power supply voltage detector 21 comprises a buffer string 201 comprising N buffers. The power supply voltage detector 21 also comprises N latch chains 202.

Among the N buffers, an input terminal of a first buffer is connected to a clock signal. An output terminal of the first buffer is connected to an input terminal of a second buffer. The output terminal of the first buffer is also connected to a data input terminal (D terminal) of the first latch in a first latch chain. Here, the first buffer before the data input terminal of the first latch can delay the clock signal by a time delay of one buffer, and then input the delayed clock signal to the data input terminal of the first latch as a data input signal. This is to stagger the rising edge of the data input signal of the first latch from a clock-enable signal, so as to avoid metastability caused due to the failure of meeting the setup time.

The output terminal of the second buffer is connected to the input terminal of a third buffer, and so on. An output terminal of an $n^{th}$ buffer is connected to an input terminal of an $(n+1)^{th}$ buffer, wherein N and n are positive integers, and n is greater than 1 and less than N. The output terminal of the $n^{th}$ buffer is connected to the data input terminal (D terminal) of a first latch in an $n^{th}$ latch chain.

In the N latch chains 202, each latch chain comprises M latches, a clock input terminal (CLK terminal) of each latch is connected to the clock signal, the data input terminal (D terminal) of the first latch of each latch chain is connected to the output terminal of a corresponding buffer among the N buffers, a data output terminal (Q terminal) of the first latch is connected to the data input terminal (D terminal) of the second latch, and the data output terminal (Q terminal) of an $m^{th}$ latch is connected to the data input terminal (D terminal) of an $(m+1)^{th}$ latch, wherein M and m are positive integers, and m is greater than 1 and less than M. The power supply input VDD terminal of each latch is connected to an area in an integrated circuit power supply network 23 where a power supply voltage is to be detected, and a grounding terminal (GND) of each latch is connected to the ground.

That is to say, in one latch chain, the clock input terminals of all the latches are connected with the clock signal, and the same clock signal is connected to the data input terminal of the first latch (here, the first latch is the latch closest to the buffer) through one buffer, the data output terminal of the first latch is connected to the data input terminal of the second latch, the data output terminal of the second latch is connected to the data input terminal of a third latch, and so on. The data output terminal of an $(m-1)^{th}$ latch is connected to the data input terminal of an $m^{th}$ latch, and a data output terminal of the $m^{th}$ latch is connected to a data input terminal of an $(m+1)^{th}$ latch. The data output terminal of each latch is connected to the voltage regulation module.

In one embodiment, N is obtained by rounding up a result of dividing the time delay of a single latch by the time delay of a single buffer. The value of N is determined considering the number of buffers through which the clock signal can pass within the time delay of one latch. In one embodiment, M is greater than or equal to more than 1 time of the result of dividing a cycle of the clock signal by the time delay of the single latch. In a more preferred embodiment, M is greater than or equal to 1.5 times the result of dividing the cycle of the clock signal by the time delay of the single latch. If the value of M is determined to be a larger value, it can be inferred in what range a transmission time delay of the input signal is in the latch chain. Assuming that the time delay of one latch under a normal voltage (or rated voltage) is about 100 ps and the time delay of one buffer under a normal voltage (or rated voltage) is about 30 ps, then N=4 and M=10.

Note that an RSTB reset terminal of each latch can receive a reset signal to reset the latch. A QN terminal of each latch outputs a signal that is opposite to the signal output by the data output terminal Q, and may be floating.

It is found that the magnitude of voltage will affect the time delay of the latch. When the magnitude of the voltage is lower than the normal voltage, the time delay of the latch will become longer, which may lead to the inability of work. When the magnitude of the voltage is higher than the normal voltage, the time delay of the latch will be shorter and the power consumption will be high. Therefore, it is feasible to use the number of latches in the latch chain through which the clock signal can transmit in one clock cycle to detect the magnitude of the voltage, and to judge whether the voltage is higher or lower than the normal voltage (or a certain predetermined voltage).

In one embodiment, the voltage regulation module obtains logic values according to comparison between the data output of each latch and a reference level to obtain a logic value string of each latch chain.

In one embodiment, if the data output of the latch is higher than the reference level, then the logic value is a first value, and if the data output of the latch is lower than the reference level, then the logic value is a second value.

Figure 4:
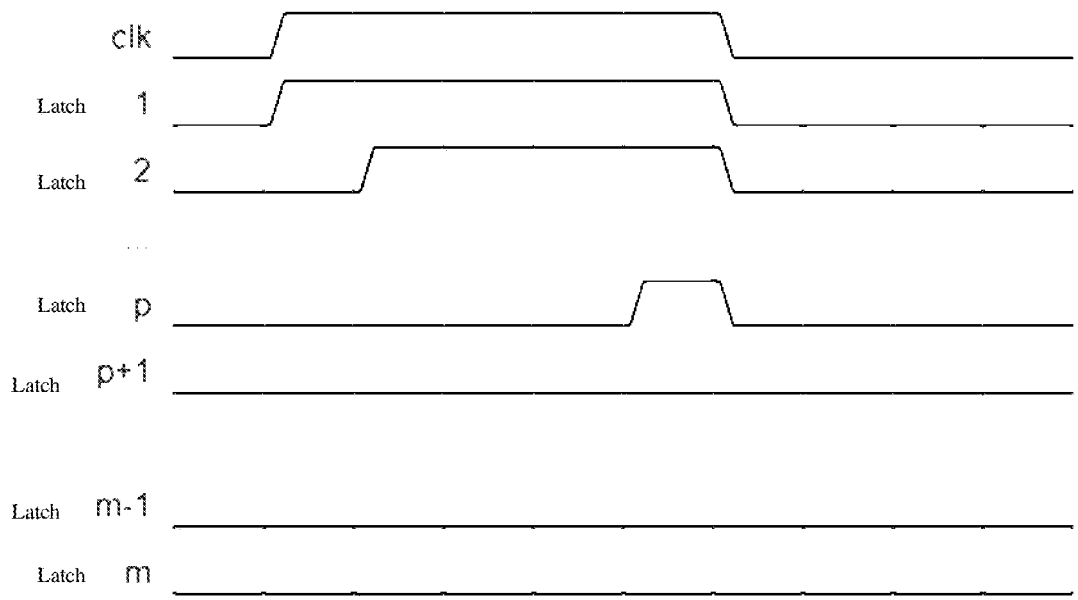
FIG. 4 shows a timing chart of a clock signal and an input signal of a data input terminal of each latch in a latch chain according to an embodiment of the present disclosure.

FIG. 4 shows a timing chart of a clock signal and an input signal of a data input terminal of each latch in a latch chain according to an embodiment of the present disclosure.

Assuming that these latches are all high-level-enabled, when the clock signal (CLK) is at a high level, the clock signal may be transmitted from the data input terminal of the latch, passing through the data input terminal of a first, second, ... $p^{th}$ latch in turn, until the clock signal is at a low level. At this time, the values stored and output by the first p latches are at a high level, i.e., higher than or equal to the reference level, which is a logic "1" (the first value is 1), and then the values stored and output by the next (m-p) latches are at a low level, i.e., lower than the reference level, which is a logic "0" (the second value is 0). That is to say, the levels output by the data output terminals of the first p latches are higher than or equal to the reference level, and the levels output by the data output terminals of the next (m-p) latches are lower than the reference level. The logical value string of the latch chain is a string composed of p 1s and (m-p) 0s.

When the power supply voltage of the latch chain fluctuates, the time delay of the latch will also fluctuate. When the voltage is lower than the normal voltage, the time delay of the latch will become longer, and when the voltage is higher than the normal voltage, the time delay of the latch will become shorter. Therefore, for the same clock signal, the number p of latches with the stored logical "1" value may also change after being measured once. For example, when the voltage is 1.05V and higher than 1V, the time delay of the latch becomes shorter, and the clock signal can transmit through more latches in one clock cycle, for example, p=8; when the voltage is 0.9V and lower than 1V, the time delay of the latch becomes longer, and the clock signal can transmit through fewer latches in one clock cycle, for example, p=4. Therefore, the change of the number (i.e., p) of the first values, in the logical value string composed of the values output by each latch in one latch chain, can indirectly reflect the change of the power supply voltage.

In one embodiment, the voltage regulation module determines the magnitude of the power supply voltage of the area in the integrated circuit power supply network where the power supply voltage is to be detected according to the logical value strings of the N latch chains and the relationship between the values of the logical value strings of the N latch chains and the power supply voltage. In one embodiment, the relationship between the values of logical value strings of the N latch chains and the power supply voltage is obtained through experimental measurement.

That is to say, when it is known that the power supply voltage of the latch chain fluctuates, the time delay of the latches will also fluctuate, which will lead to the change of the number of the first values (p) in the logical value string composed of the values output by each latch in one latch chain. Therefore, it is possible to obtain the relationship between the value of p in each of the N latch chains and the magnitude of the voltage through a series of experiments. For example, by inputting low voltages such as 0.9V, 0.95V, etc. respectively into the latch chain, the value of p in each of the N latch chains under different low voltages can be obtained. The same is true for high voltages. A mapping table about the mapping relationship between the magnitude of the voltage and the value of p in each of the N latch chains can be obtained. In this way, the power supply voltage of the area in the integrated circuit power supply network where the power supply voltage is to be detected can be quickly determined, or the amplitude of voltage sag may be directly obtained, from the logical value strings of the N latch chains and the relationship between the values of the logical value strings of the N latch chains and the magnitude of the power supply voltage (for example, the generated mapping table).

Alternatively, in another embodiment, the time delay range of respective latches of a plurality of latch chains is obtained according to the logical value strings of a plurality of latch chains and time length of the high level of the clock signal; an actual time delay range of a single latch is obtained according to the time delay ranges of the latches of each of the plurality of latch chains; and the magnitude of the power supply voltage of the area in the integrated circuit power supply network where the power supply voltage is to be detected is determined according to the relationship between the actual time delay range of the single latch and the magnitude of the power supply voltage.

Firstly, the time delay ranges of the latches of each of the plurality of latch chains can be obtained according to the logical value strings of a plurality of latch chains and the time length of the high level in the clock signal through the following methods.

In a first embodiment, the voltage regulation module is configured to obtain the time delay ranges of the latches of each of the plurality of latch chains according to the logical value strings of a plurality of latch chains and the time length of the high level in the clock signal through the following steps: determining the number of the first values in the logical value string in one predetermined latch chain; determining the number of buffers between the predetermined latch chain and the input clock signal; determining that the time length of the high level in the clock signal is greater than a sum of a product of the number of the buffers and a time delay of a single buffer and a product of the number of the first values and a time delay of a single latch, and less than a sum of a product of the number of buffers before the latch chain and the time delay of the single buffer and a product of a result of the number of the first values plus 1 and the time delay of the single latch; and calculating an actual time delay range of the single latch.

Specifically, since the delay of the single latch is relatively long, if only the single latch chain is used for monitoring, its voltage detection accuracy may be relatively low, i.e., the value of p may change only when the voltage changes greatly. In order to improve the monitoring accuracy, this application uses N latch chains, and all the latches are enabled by the same clock signal, so all the latches have the same test period, i.e., one clock cycle.

In addition, this clock signal is input to the data input terminal of each latch of the first latch chain through one buffer, which is mainly used to avoid metastability caused due to the failure of meeting the setup time of the latches; this clock signal is then input to the data input terminal of each latch of a second latch chain through a second buffer, to the data input terminal of each latch of a third latch chain through a third buffer, and to the data input terminal of each latch of an $n^{th}$ latch chain through an $n^{th}$ buffer. In this way, the input signal of each latch chain is delayed in turn by the time delay of one buffer.

As the magnitude of the voltage will infect the length of the time delay of the latch and the buffer, it will be demonstrated below the relationship between the time length of the high level in the clock signal and the time delay of the latch and the buffer, as well as the principle that using the N latch chains can achieve higher detection accuracy.

Assuming that the power supply voltage with a certain value (for example, 0.95V) is known, it is known correspondingly that the time delay of one latch is 100 ps, and the time delay of one buffer is 30 ps, and then taking N=4 and M=10. After the clock signal enables four latch chains once in one clock cycle, the logic values of the data stored in the four latch chains are 1111110000, 1111110000, 1111100000, 1111100000, respectively. Then within one clock cycle, the actual transmission time delay of the input signal (i.e., the time length of the high level in the clock signal) should meet the following conditions:

For the first latch chain, the actual transmission time delay of the input signal (i.e., the time length of the high level in the clock signal) is greater than a sum of a product of the number of the buffers and a time delay of a single buffer and a product of the number of the first values and a time delay of a single latch (i.e. >6*100+1*30=630 ps), and less than a sum of a product of the number of buffers before the latch chain and the time delay of the single buffer and a product of a result of the number of the first values plus 1 and the time delay of the single latch; calculate the transmission time delay of the input signal (i.e. <7*100+1*30=730 ps), i.e., between 630 ps and 730 ps. For the second latch chain, the transmission time delay of the input signal (i.e., the time length of the high level in the clock signal) (i.e. >6*100+2*30=660 ps and <7*100+2*30=760 ps), is between 660 ps and 760 s. For the third latch chain, the transmission time delay of the input signal (i.e. the time length of the high level in the clock signal) (i.e. >5*100+3*30=590 ps and <6*100+3*30=690 ps), is between 590 ps and 690 ps. For the fourth latch chain, the transmission time delay of the input signal (i.e., the time length of the high level of the clock) (i.e. >5*100+4*30=620 ps and <6*100+4*30=720 ps) is between 620 ps and 720 ps. Since these four latches are connected to the same input signal, it can be judged that the actual transmission time delay of the input signal (i.e., the time length of the high level in the clock signal) is constrained by the four ranges calculated from the four latch chains, i.e., the actual transmission time delay of the input signal finally falls in the range of 660 ps-690 ps.

Therefore, compared with using the single latch chain (only between 630 ps-730 ps, for example), the accuracy of detecting the actual transmission time delay of the input signal (i.e., the time length of the high level in the clock signal) is greatly improved (between 660 ps-690 ps, for example).

Of course, the above examples are only to illustrate the relationship between the time delay of the single latch, the time delay of the single buffer and the actual transmission time delay of the input signal (i.e., the time length of the high level in the clock signal). The purpose of this application is to obtain the time delay of the single latch, so as to know the magnitude of the power supply voltage. Therefore, when the power supply voltage is unknown and the time delay of the single latch and the buffer are also unknown, since the time length of the high level of the input clock signal is known, the time delay range of the single latch may also be deduced from the same formula and relationship as the above examples.

Specifically, in the actual test and use, the application adopts a fixed input signal (clock signal), i.e., the time length of the high level of the input clock signal is known, and the time delay range of the single latch can be determined by determining a path length that the fixed input signal can transmit through (corresponding to the time length of the high level of the input clock signal).

For example, assuming that the length of the high-level-enable signal of the clock signal (i.e., the length of the high level) is 500 ps (e.g., a clock signal with a cycle of 1000 ps and a duty cycle of 50%), still taking N=4 and M=10 under the relationship between the time delay of the latch and the time delay of the buffer under the normal voltage. Assuming that the time delay of the single buffer under the current power supply voltage is x, the time delay of the single latch is y (at this time, x and y are uncertain because the power supply voltage is not necessarily the normal voltage), then after the clock signal performs enabling once (for the time length of one high level of the clock signal), the data stored in the four latch chains are 111111000, 1111110000, 1111100000, 1111100000 respectively.

According to the relationship obtained from the above examples, it can be judged that for the first latch chain, x+5y<500 ps<x+6y; for the second latch chain, 2x+5y<500 ps<2x+6y; for the third latch chain, 3x+4y<500 ps<3x+5y; for the fourth latch chain, 4x+4y<500 ps<4x+5y.

According to the constraints of range of the above four latch chains, after transformation, the formulas become:

$$\left\{ y < 100 - \frac{x}{5} \wedge y > \frac{250}{3} - \frac{x}{6}, y < 100 - \frac{2x}{5} \wedge y > \frac{250}{3} - \frac{x}{3}, \right.$$
$$\left. y < 125 - \frac{3x}{4} \wedge y > 100 - \frac{3x}{5}, y < 125 - x \wedge y > 100 - \frac{4x}{5} \right\}$$

wherein $\wedge$ is a logic AND function. And then after another transformation, the formulas become:

$$0 < x \le \frac{500}{13}, \frac{1}{5}(500 - 3x) < y < -\frac{2}{5}(x - 250)$$
$$\frac{500}{13} < x \le \frac{125}{3}, \frac{500 - x}{6} < y < -\frac{2}{5}(x - 250)$$
$$\frac{125}{3} < x < 50, \frac{500 - x}{6} < y < 125 - x$$

The followings can be got:

$$\frac{125}{3} < x < 50, \frac{500 - x}{6} < y < 125 - x$$

Figure 11A:
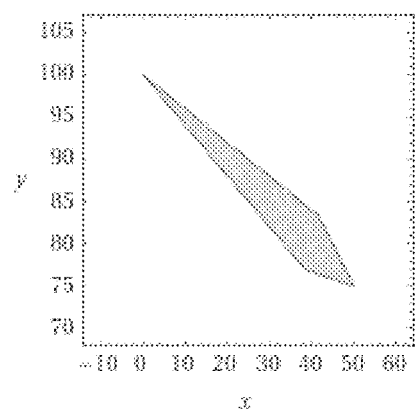
FIG. 11A and FIG. 11B respectively show a representation of value ranges of x and y on a two-dimensional coordinate axis, wherein the value ranges of x and y are obtained through a range constraint of four latch chains and a range constraint of a first latch chain.

Herein the value ranges of x and y are represented on the two-dimensional coordinate axis as shown in FIG. 11A:

Then, the range of the time delay y of the single latch is 75 ps<y<100 ps.

In contrast, the constraints x+5y<500 ps<x+6y and x>0 of the first latch chain can only get:

$$0 < x < 500, \frac{500 - x}{6} < y < \frac{500 - x}{5}$$

Figure 11B:
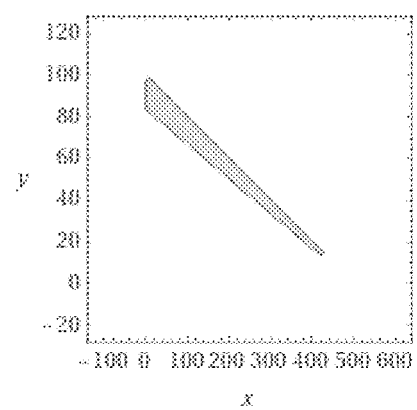

The value ranges of x and y are represented on the two-dimensional coordinate axis as shown in FIG. 11B:

It can only be determined that the time delay range y of the single latch in the first latch chain is 0 ps<y<100 ps.

Therefore, using multiple latch chains to make the measurement can obviously improve the accuracy of the estimation on the time delay of the single latch.

Under different power supply voltages, the time delay of the latches will change. In one embodiment, the relationship between the actual time delay range of the single latch and the power supply voltage can be obtained through experimental measurement. For example, by testing the results output by the N latch chains under different power supply voltages, the actual time delay range of the single latch can be calculated, so that testers can establish a lookup table to map the actual time delay range of the single latch with the corresponding power supply voltage. During actual use, according to the results output by the N latch chains, the actual time delay range of the single latch is calculated, and the current power supply voltage is inferred in turn according to the lookup table, and the voltage regulation unit performs a corresponding regulation accordingly.

In one embodiment, the voltage regulation module is configured to: increase the power supply voltage to compensate for voltage sag when the determined power supply voltage is lower than a predetermined voltage, or decrease the power supply voltage to compensate for voltage rise when the determined power supply voltage is higher than the predetermined voltage. That is, in this embodiment, the voltage regulation module can detect whether there is a voltage sag, and can increase the voltage of the area to compensate for the voltage sag according to the determined amplitude of the voltage sag. Of course, the voltage regulation module can also decrease the inferred power supply voltage to maintain the voltage at the target voltage when the voltage is higher than the target voltage.

Note that the RSTB reset terminal of each latch can receive a reset signal to reset the latch.

In one embodiment, the N latch chains in the power supply voltage detector are enabled at the rising edge of the clock signal and output data at the falling edge of the clock signal. After outputting data, each latch is reset by the reset signal. Then, the N latch chains are enabled at the rising edge of the next clock signal, and output data and are reset at the falling edge of the clock signal, and so on. This structure performs tests when the clock is at a high level, outputs the test results when the clock is at a low level, and resets all the latches to wait for the next test.

In order to increase the response speed, two groups of latch chains may be used to measure respectively during the high level of the clock and the low level of the clock, and then output the test results during the low level of the clock and high level of the clock, so as to output the test results twice in each clock cycle. In this way, a voltage sag pulse or voltage rise pulse with a short duration can be detected. That is, in one alternative embodiment, the power supply voltage detector further comprises other N latch chains with the same structure as the N latch chains and other N buffers, and enables the N latch chains at the rising edge of the clock signal and outputs data at the falling edge of the clock signal. Then, after the data is output, the latches of the N latch chains are reset by the reset signal. And the power supply voltage detector enables the other N latch chains at the falling edge of the clock signal, and outputs data at the rising edge of the clock signal. Then, after the data is output, the latches of the other N latch chains are reset by the reset signal.

The advantages of the technical scheme of the application over the prior art comprise but are not limited to:

1. Compared with using a digital-to-analog conversion circuit, resistors or capacitors, this structure uses a pure digital structure, which can be realized by using devices in a standard cell library, and can be directly synthesized, which is very friendly to an integrated circuit design process.

2. This structure has a high response frequency and can output a voltage detection result every clock cycle.

3. This structure has high detection accuracy, and voltage change detection accuracy of about 6 mV can be achieved at a working frequency of 1.5 GHz.

4. This structure can be adapted to different working frequencies, and no additional time delay regulation circuit is needed;

5. This structure only needs a small area overhead, and has little influence on the original integrated circuit design.

6. In this structure, all the latch circuits and other latch circuits nearby are connected to the same power supply network instead of a desired power supply, so it is easy for them to be integrated at a back end of the integrated circuit.

FIG. 5 shows a flowchart of a power supply voltage detection method 500 according to an embodiment of the present disclosure. The method 500 comprises the following steps: at step 501, providing a power supply voltage detector which comprises a buffer string, comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; N latch chains, each of which comprises M latches, a clock input terminal of each latch is connected to a clock signal, a data input terminal of a first latch of each latch chain is connected to the output terminal of a corresponding buffer among the N buffers, a data output terminal of the first latch is connected to the data input terminal of the second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area in an integrated circuit power supply network where a power supply voltage is to be detected, and a grounding terminal of each latch is connected to a ground; and step 502, detecting data output of each latch to determine a magnitude of a power supply voltage of the area in the integrated circuit power supply network where the power supply voltage is to be detected.

Here, the first buffer before the data input terminal of the first latch can delay the clock signal by the time delay of one buffer, and then input the clock signal to the data input terminal of the first latch as a data input signal. This is to stagger the data input signal of the first latch from the rising edge of a clock-enable signal, so as to avoid metastability caused due to the failure of meeting the setup time.

Note that the RSTB reset terminal of each latch can receive a reset signal to reset the latch. The QN terminal of each latch is floating.

In this way, by detecting the data output of each latch, it is possible to determine the magnitude of the power supply voltage of the area in the integrated circuit power supply network where the power supply voltage is to be detected. Compared with using the digital-to-analog conversion circuit, resistors and capacitors, this structure uses the pure digital structure, which can be realized by using the devices in the standard cell library, and can be directly synthesized, which is very friendly to the integrated circuit design process. This structure has a relatively high response frequency and can output a voltage detection result every clock cycle. This structure has relatively high detection accuracy, and voltage change detection accuracy of about 6 mV can be achieved under the working frequency of 1.5 GHz. This structure can be adapted to different working frequencies, so no additional time delay regulation circuit is needed; This structure only needs a very small area overhead, and has little influence on the original integrated circuit design. In this structure, all the latch circuits and other latch circuits nearby are connected to the same power supply network instead of a desired power supply, so it is easy for them to be integrated at a back end of the integrated circuit.

In one embodiment, the relationship between the actual time delay range of the single latch and the magnitude of the power supply voltage is obtained through experimental measurement, or the relationship between the values of the logical value strings of the N latch chains and the magnitude of the power supply voltage is obtained through experimental measurement.

In one embodiment, N is a number obtained by rounding up a result of dividing the time delay of the single latch by the time delay of the single buffer.

In one embodiment, M is greater than or equal to a value above once a result of dividing a cycle of the clock signal by the time delay of the single latch.

In one embodiment, M is greater than or equal to 1.5 times the result of dividing the cycle of the clock signal by the time delay of the single latch.

Assuming that the power supply voltage of a certain value is known, it is known correspondingly that the time delay of one latch is 100 ps, and the time delay of one buffer is 30 ps, and then take N=4 and M=10.

Figure 6A:
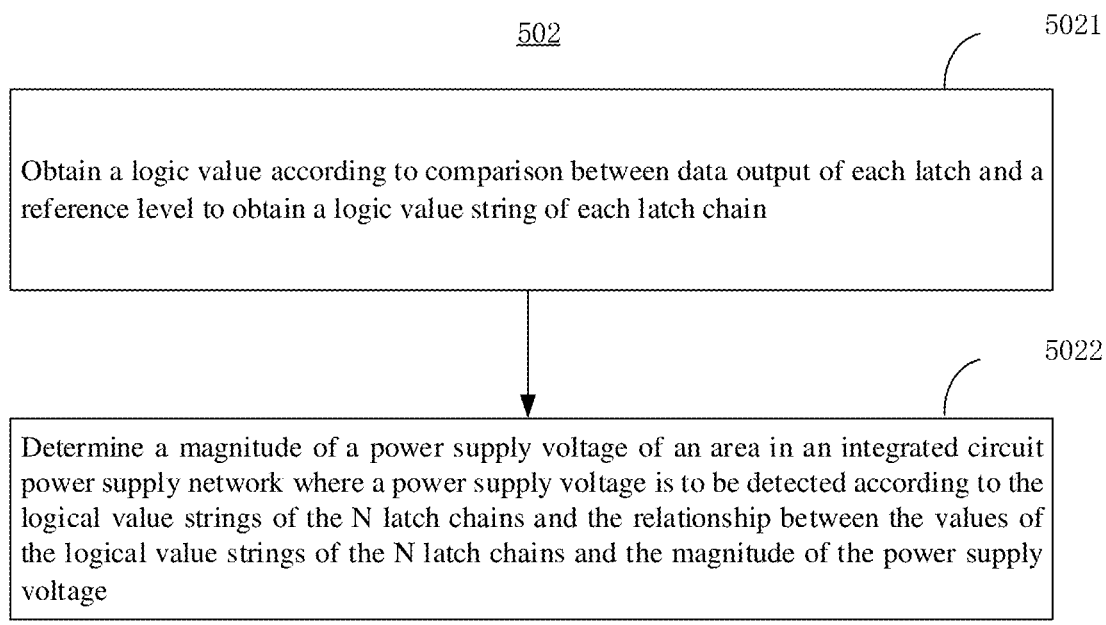
FIG. 6A shows one embodiment of a step of detecting data output of each latch to determine a magnitude of a power supply voltage of an area in an integrated circuit power supply network where the power supply voltage is to be detected according to an embodiment of the present disclosure.

FIG. 6A shows one embodiment of a step 502 of detecting data output of each latch to determine a magnitude of a power supply voltage of an area in an integrated circuit power supply network where the power supply voltage is to be detected according to an embodiment of the present disclosure.

In this embodiment, the step 502 of detecting the data output of each latch to determine the magnitude of the power supply voltage of the area in the integrated circuit power supply network where the power supply voltage is to be detected comprises the following steps:

At step 5021, a logic value is obtained according to comparison between the data output of each latch and a reference level to obtain a logic value string of each latch chain;

At step 5022, the magnitude of a power supply voltage of an area in an integrated circuit power supply network where a power supply voltage is to be detected is determined according to the logical value strings of the N latch chains and the relationship between the values of the logical value strings of the N latch chains and the magnitude of the power supply voltage.

In one embodiment, if the data output of the latch is higher than the reference level, then the logic value is a first value, and if the data output of the latch is lower than the reference level, then the logic value is a second value. For example, the data output of the latch is higher than or equal to the reference level, which is a logic "1" (the first value is 1), while the data output of the latch is lower than the reference level, which is a logic "0" (the second value is 0).

After the clock signal enables four latch chains once in one clock cycle, the logic values of the data stored in the four latch chains are 1111110000, 1111110000, 1111100000, 1111100000, respectively. If the relationship between the values of the logical value strings of the N latch chains and the magnitude of the power supply voltage is obtained through experimental measurement in advance, for example, if the logical values of the data stored in the four latch chains are 1111110000, 1111110000, 1111100000, 1111100000, the power supply voltage is 0.95V.

In this way, it can be directly determined that the magnitude of the power supply voltage of the area in the integrated circuit power supply network where the power supply voltage is to be detected is 0.95V according to the logical value strings 1111110000, 1111110000, 1111100000, 1111100000 of the N latch chains and the relationship between the values of the logical value strings of the N latch chains and the magnitude of the power supply voltage. This scheme is convenient and quick.

Figure 6B:
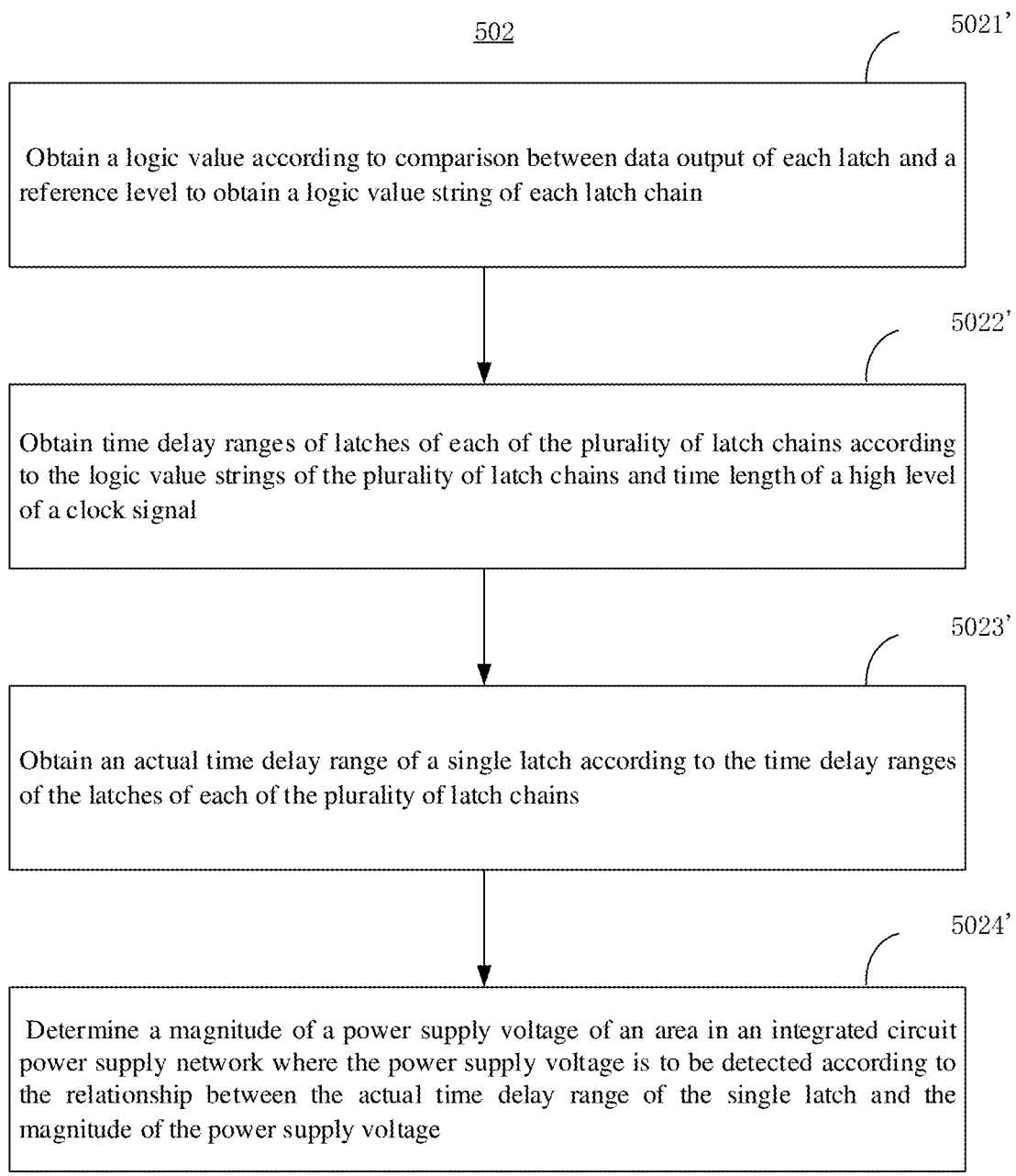
FIG. 6B shows another embodiment of a step of detecting the data output of each latch to determine the magnitude of the power supply voltage of the area in the integrated circuit power supply network where the power supply voltage is to be detected according to an embodiment of the present disclosure.

FIG. 6B shows another embodiment of the step 502 of detecting the data output of each latch to determine the magnitude of the power supply voltage of the area in the integrated circuit power supply network where the power supply voltage is to be detected.

In this embodiment, the step 502 of detecting the data output of each latch to determine the magnitude of the power supply voltage of the area in the integrated circuit power supply network where the power supply voltage is to be detected comprises the following steps:

At step 5021', a logic value is obtained according to comparison between the data output of each latch and a reference level to obtain a logic value string of each latch chain;

At step 5022', a time delay range of respective latches of a plurality of latch chains is obtained according to the logic value strings of the plurality of latch chains and time length of a high level of a clock signal;

At step 5023', an actual time delay range of the single latch is obtained according to the time delay ranges of the latches of each of the plurality of latch chains;

At step 5024', the magnitude of the power supply voltage of the area in the integrated circuit power supply network where the power supply voltage is to be detected is determined according to the relationship between the actual time delay range of the single latch and the magnitude of the power supply voltage.

Figure 7:
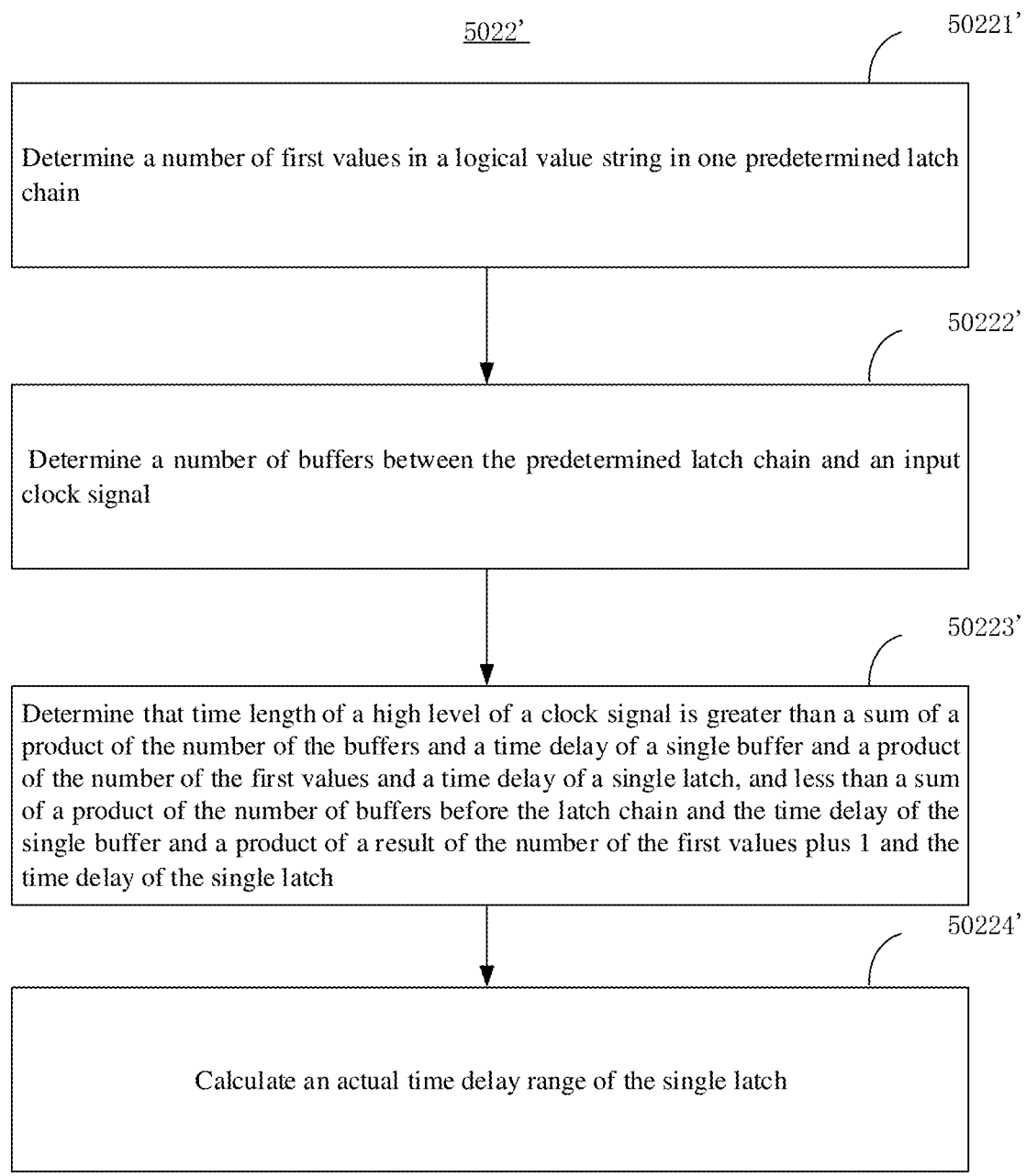
FIG. 7 shows a flowchart of specific steps of a step of obtaining a time delay range of respective latches of a plurality of latch chains according to logical value strings of a plurality of latch chains and time length of a high level of the clock signal according to an embodiment of the present disclosure.

FIG. 7 shows a flowchart of specific steps of a step 5022' of obtaining a time delay range of respective latches of a plurality of latch chains according to logical value strings of a plurality of latch chains and time length of a high level of the clock signal according to an embodiment of the present disclosure.

The step 5022' of obtaining the time delay ranges of the latches of each of the plurality of latch chains according to the logical value strings of a plurality of latch chains and the time length of the high level in the clock signal comprises the following steps:

At Step S0221', a number of the first values in the logical value string of a predetermined latch chain is determined;

At Step S0222', a number of buffers between the predetermined latch chain and the input clock signal;

At Step S0223', it is determined that the time length of the high level in the clock signal is greater than a sum of a product of the number of the buffers and a time delay of a single buffer and a product of the number of the first values and a time delay of a single latch, and less than a sum of a product of the number of buffers before the latch chain and the time delay of the single buffer and a product of a result of the number of the first values plus 1 and the time delay of the single latch; and At Step S0224', the actual time delay range of the single latch.

For example, it is assumed that the length of a high-level-enable signal of the clock signal (i.e., the time length of the high-level) is 500 ps. When N=4 and M=10, assuming that the time delay of the single buffer under the current power supply voltage is x, the time delay of the single latch is y, then after the clock signal performs the enabling once (for the time length of one high level), the data stored in the four latch chains are 111111000, 1111110000, 1111100000, 1111100000 respectively.

According to the relationship obtained from the above examples, it can be judged that for the first latch chain, x+5y<500 ps<x+6y; for the second latch chain, 2x+5y<500 ps<2x+6y; for the third latch chain, 3x+4y<500 ps<3x+5y; for the fourth latch chain, 4x+4y<500 ps<4x+5y.

Then the range of the time delay y of the single latch is 75 ps<y<100 ps.

If the relationship between the actual time delay range of the single latch and the magnitude of the power supply voltage is obtained through experimental measurement in advance, for example, when the actual time delay range of the single latch obtained in advance is 75 ps<y<100 ps, the power supply voltage is 0.95V, then it can be directly determined that the power supply voltage of the area in the integrated circuit power supply network where the power supply voltage is to be detected should be 0.95V according to the relationship between the actual time delay range of the single latch and the magnitude of the power supply voltage. This method is convenient and quick.

Figure 8:
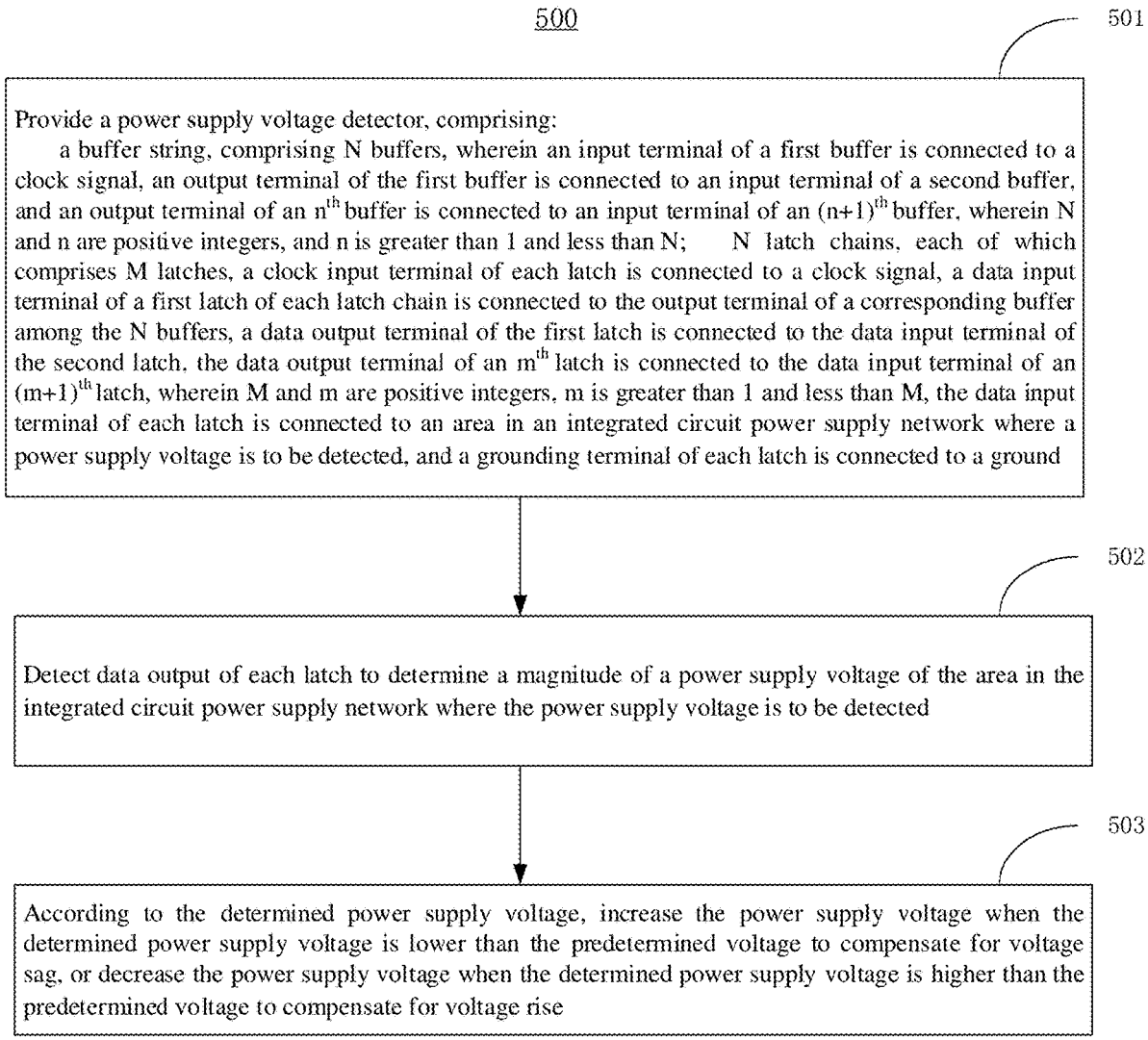
FIG. 8 shows a flowchart of a power supply voltage detection method according to another embodiment of the present disclosure.

FIG. 8 shows a flowchart of a power supply voltage detection method 500 according to another embodiment of the present disclosure.

In this embodiment, in addition to the steps 501 and 502, the power supply voltage detection method 500 may further comprise: step 503, according to the determined power supply voltage, increasing the power supply voltage when the determined power supply voltage is lower than the predetermined voltage, to compensate for voltage sag, or decreasing the power supply voltage when the determined power supply voltage is higher than the predetermined voltage, to compensate for voltage rise.

In this way, not only the magnitude of the power supply voltage can be detected, but also the voltage can be regulated according to the relationship between the power supply voltage and the predetermined voltage to maintain the power supply voltage at the predetermined voltage. Of course, this scheme is not limited to this, and other voltage regulations may be made or other implementations may be made by using the magnitude of the power supply voltage after the power supply voltage is detected, which will not be described in detail here.

In one embodiment, the N latch chains in the power supply voltage detector are enabled at the rising edge of the clock signal, and output data and are reset at the falling edge of the clock signal. In this way, in one clock cycle, one detection and output can be performed.

Or, in another embodiment, the power supply voltage detector further comprises other N latch chains with the same structure as the N latch chains as well as other N buffers, and enables the N latch chains at the rising edge of the clock signal and outputs data and resets at the falling edge of the clock signal. And the power supply voltage detector enables the other N latch chains at the falling edge of the clock signal, and outputs data and resets at the rising edge of the clock signal. In this way, two groups of latch chains are used to measure during the high level and low level of the clock respectively, and then output the test results during the low level and high level of the clock, so that the test results can be output twice in each clock cycle, which can improve the response speed, and can also detect the voltage sag pulse or the voltage rise pulse with a short duration.

In a word, the advantages of the technical scheme of the application over the prior art comprise but are not limited to:

1. Compared with using a digital-to-analog conversion circuit, a resistor or a capacitor, this structure uses a pure digital structure, which can be realized by using devices in a standard cell library, and can be directly synthesized, which is very friendly to an integrated circuit design process.

2. This structure has a high response frequency and can output a voltage detection result every clock cycle.

3. This structure has high detection accuracy, and voltage change detection accuracy of about 6 mV can be achieved at a working frequency of 1.5 GHz.

4. This structure can be adapted to different working frequencies, and no additional time delay regulation circuit is needed;

5. This structure only needs a small area overhead, and has little influence on the original integrated circuit design.

6. In this structure, all the latch circuits and other latch circuits nearby are connected to the same power supply network instead of a desired power supply, so it is easy for them to be integrated at a back end of the integrated circuit.

Figure 9:
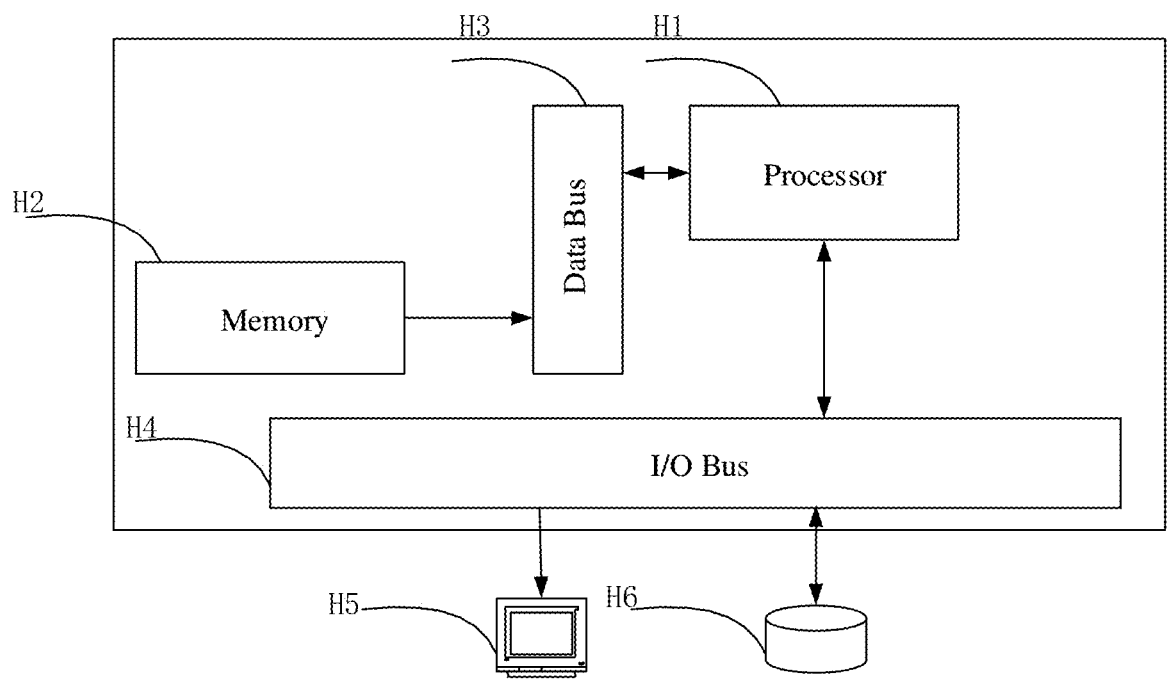
FIG. 9 shows a block diagram of an exemplary computer system suitable for implementing embodiments of the present disclosure.

FIG. 9 shows a block diagram of an exemplary computer system suitable for implementing embodiments of the present disclosure.

The computer system may comprise a processor (H1); a memory (H2) coupled to the processor (H1) and storing therein computer executable instructions for performing the steps of the respective methods of the embodiments of the present disclosure when executed by the processor.

The processor (H1) may comprise, but is not limited to, one or more processors or microprocessors, for example.

The memory (H2) may comprise, but is not limited to, a Random Access Memory (RAM), a Read Only Memory (ROM), a flash memory, an EPROM memory, an EEPROM memory, a register, a computer storage medium (such as a hard disk, a floppy disk, a solid state disk, a removable disk, a CD-ROM, a DVD-ROM, a Blu-ray disk, etc.).

Besides, the computer system may also comprise a data bus (H3), an input/output (I/O) bus (H4), a display (H5), and input/output devices (H6) (e.g., keyboard, mouse, speaker, etc.).

The processor (H1) can communicate with external devices (H5, H6, etc.) via a wired or wireless network (not shown) through the I/O bus (H4).

The memory (H2) may also store at least one computer executable instruction for executing the steps of various functions and/or methods in the embodiments described in this technology when executed by the processor (H1).

In one embodiment, the at least one computer-executable instruction may also be compiled into or constitute a power supply voltage detection software product, wherein the one or more computer-executable instructions, when executed by the processor, perform the steps of various functions and/or methods in the embodiments described in this technology.

Figure 10:
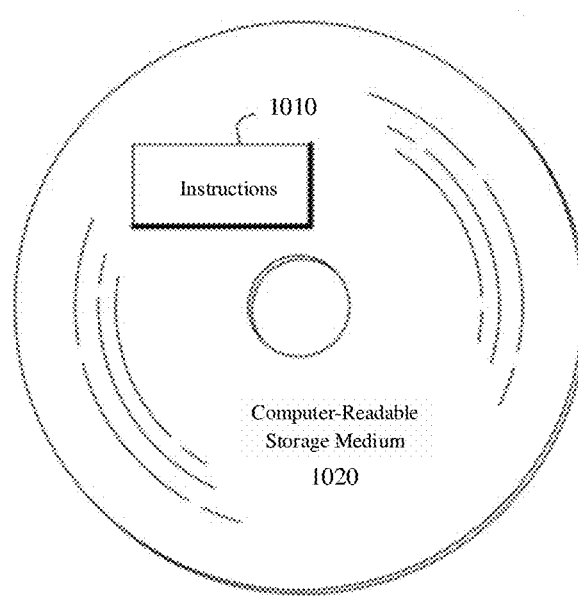
FIG. 10 shows a schematic diagram of a non-transitory computer readable storage medium according to an embodiment of the present disclosure.

FIG. 10 shows a schematic diagram of a non-transitory computer readable storage medium according to an embodiment of the present disclosure.

As shown in FIG. 10, the computer-readable storage medium 1020 stores instructions, such as computer-readable instructions 1010. When the computer readable instructions 1010 are executed by a processor, the power supply voltage detection method described with reference to the above drawings can be executed. The computer readable storage medium comprises, but is not limited to, a volatile memory and/or a nonvolatile memory, for example. The volatile memory may comprise, for example, a Random Access Memory (RAM) and/or a cache, etc. The non-volatile memory may comprise, for example, a Read Only Memory (ROM), a hard disk, a flash memory, etc. For example, the computer-readable storage medium 1020 may be connected to a computing device such as a computer, and then, when the computing device runs the computer-readable instructions 1010 stored in the computer-readable storage medium 1020, the power supply voltage detection method as described above may be performed.

Of course, the above-mentioned specific embodiments are only examples rather than limitations, and those skilled in the art may combine some steps and apparatuses from the above-mentioned separately described embodiments according to the concept of this disclosure to achieve the effects of this disclosure. Such combined embodiments are also included in this disclosure, and will not be described one by one here.

Note that the advantages, merits, effects, etc. mentioned in this disclosure are only examples rather than limitations, and these advantages, merits, effects, etc. should not be considered as necessary for each embodiment of this disclosure. In addition, the specific details of the above disclosure are only for the purpose of illustration and easy understanding, rather than limitation, and the above details do not limit that this disclosure must be implemented with the above specific details.

According to one or more embodiments of the present disclosure, it is provided a power supply voltage detection apparatus connected to an integrated circuit power supply network, which comprises: a power supply voltage detector comprising a buffer string which comprises N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; N latch chains, each of which comprises M latches, wherein a clock input terminal of each latch is connected to the clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area of where the power supply voltage is to be detected in the integrated circuit power supply network, and a grounding terminal of each latch is connected to a ground; and a voltage regulation module, connected to the data output terminal of each latch of each latch chain and configured to detect data output of each latch to determine the power supply voltage of the area in the integrated circuit power supply network where the power supply voltage is to be detected.

In one embodiment, the voltage regulation module is configured to: obtain the logical value string of each latch chain through the logical values obtained according to the comparison between the data output of each latch and the reference level; determine the magnitude of the power supply voltage of the area in the integrated circuit power supply network where the power supply voltage is to be detected according to the logical value strings of the N latch chains and the relationship between the values of the logical value strings of the N latch chains and the power supply voltage; or the voltage regulation module is configured to obtain a logic value according to comparison between the data output of each latch and a reference level to obtain a logic value string of each latch chain; obtain the time delay range of respective latches of a plurality of latch chains according to the logical value strings of a plurality of latch chains and time length of the high level of the clock signal; obtain an actual time delay range of a single latch according to the time delay ranges of the latches of each of the plurality of latch chains; and determine the magnitude of the power supply voltage of the area in the integrated circuit power supply network where the power supply voltage is to be detected according to the relationship between the actual time delay range of the single latch and the magnitude of the power supply voltage.

In one embodiment, if the data output of the latch is higher than the reference level, then the logic value is a first value, and if the data output of the latch is lower than the reference level, then the logic value is a second value. The voltage regulation module is configured to obtain the time delay ranges of the latches of each of the plurality of latch chains according to the logical value strings of a plurality of latch chains and the time length of the high level in the clock signal through the following steps: determining the number of the first values in the logical value string in one predetermined latch chain; determining the number of buffers between the predetermined latch chain and the input clock signal; determining that the time length of the high level in the clock signal is greater than a sum of a product of the number of the buffers and a time delay of a single buffer and a product of the number of the first values and a time delay of a single latch, and less than a sum of a product of the number of buffers before the latch chain and the time delay of the single buffer and a product of a result of the number of the first values plus 1 and the time delay of the single latch; and calculating an actual time delay range of the single latch.

In one embodiment, the voltage regulation module is configured to: increase the power supply voltage to compensate for voltage sag when the determined power supply voltage is lower than a predetermined voltage, or decrease the power supply voltage to compensate for voltage rise when the determined power supply voltage is higher than the predetermined voltage.

In one embodiment, the relationship between the actual time delay range of the single latch and the magnitude of the power supply voltage is obtained through experimental measurement, or the relationship between the values of the logical value strings of the N latch chains and the magnitude of the power supply voltage is obtained through experimental measurement.

In one embodiment, N is a number obtained by rounding up a result of dividing the time delay of the single latch by the time delay of the single buffer.

In one embodiment, M is greater than or equal to a value above once a result of dividing a cycle of the clock signal by the time delay of the single latch.

In one embodiment, M is greater than or equal to 1.5 times the result of dividing the cycle of the clock signal by the time delay of the single latch.

In one embodiment, the N latch chains in the power supply voltage detector are enabled at the rising edge of the clock signal, and output data and are reset at the falling edge of the clock signal; or, the power supply voltage detector further comprises other N latch chains with the same structure as the N latch chains and other N buffers, and enables the N latch chains at the rising edge of the clock signal and outputs data and resets at the falling edge of the clock signal. And the power supply voltage detector enables the other N latch chains at the falling edge of the clock signal, and outputs data and resets at the rising edge of the clock signal.

According to one or more embodiments of the present disclosure, it is provided a power supply voltage detection system, which comprises: a plurality of power supply voltage detection apparatuses according to the embodiments of the present disclosure connected to a plurality of areas of an integrated circuit power supply network.

According to one or more embodiments of the present disclosure, it is provided a power supply voltage detector, which comprises: a buffer string comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; N latch chains, each of which comprises M latches, a clock input terminal of each latch is connected to a clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area where the power supply voltage is to be detected in an integrated circuit power supply network, and a grounding terminal of each latch is connected to a ground.

According to one or more embodiments of the present disclosure, it is provided a power supply voltage detection method, which comprises the following steps: a power supply voltage detector is provided, which comprises a buffer string comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, where N and n are positive integers, and n is greater than 1 and less than N; N latch chains, each of which comprises M latches, wherein a clock input terminal of each latch is connected to a clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, m is greater than 1 and less than M, the power supply input VDD terminal of each latch is connected to an area where the power supply voltage is to be detected in an integrated circuit power supply network, and a grounding terminal of each latch is connected to a ground; and detecting data output of each latch to determine a magnitude of a power supply voltage of the area in the integrated circuit power supply network where the power supply voltage is to be detected.

In one embodiment, detecting the data output of each latch to determine the magnitude of the power supply voltage of the area in the integrated circuit power supply network where the power supply voltage is to be detected comprises: obtaining the logical value string of each latch chain through the logical values obtained according to the comparison between the data output of each latch and the reference level; determining the magnitude of the power supply voltage of the area in the integrated circuit power supply network where the power supply voltage is to be detected according to the logical value strings of the N latch chains and the relationship between the values of the logical value strings of the N latch chains and the power supply voltage.

Alternatively, in another embodiment, detecting the data output of each latch to determine the magnitude of the power supply voltage of the area in the integrated circuit power supply network where the power supply voltage is to be detected comprises: obtaining a logic value according to comparison between the data output of each latch and a reference level to obtain a logic value string of each latch chain; obtaining the time delay range of respective latches of a plurality of latch chains according to the logical value strings of a plurality of latch chains and time length of the high level of the clock signal; obtaining an actual time delay range of a single latch according to the time delay ranges of the latches of each of the plurality of latch chains; and determining the magnitude of the power supply voltage of the area in the integrated circuit power supply network where the power supply voltage is to be detected according to the relationship between the actual time delay range of the single latch and the magnitude of the power supply voltage.

In one embodiment, if the data output of the latch is higher than the reference level, then the logic value is a first value, and if the data output of the latch is lower than the reference level, then the logic value is a second value. The voltage regulation module is configured to obtain the time delay ranges of the latches of each of the plurality of latch chains according to the logical value strings of a plurality of latch chains and the time length of the high level in the clock signal through the following steps: determining the number of the first values in the logical value string in one predetermined latch chain; determining the number of buffers between the predetermined latch chain and the input clock signal; determining that the time length of the high level in the clock signal is greater than a sum of a product of the number of the buffers and a time delay of a single buffer and a product of the number of the first values and a time delay of a single latch, and less than a sum of a product of the number of buffers before the latch chain and the time delay of the single buffer and a product of a result of the number of the first values plus 1 and the time delay of the single latch; and calculating an actual time delay range of the single latch.

In one embodiment, the method further comprises: increasing the power supply voltage to compensate for voltage sag when the determined power supply voltage is lower than a predetermined voltage, or decreasing the power supply voltage to compensate for voltage rise when the determined power supply voltage is higher than the predetermined voltage.

In one embodiment, the relationship between the actual time delay range of the single latch and the magnitude of the power supply voltage is obtained through experimental measurement, or the relationship between the values of the logical value strings of the N latch chains and the magnitude of the power supply voltage is obtained through experimental measurement.

In one embodiment, N is a number obtained by rounding up a result of dividing the time delay of the single latch by the time delay of the single buffer.

In one embodiment, M is greater than or equal to a value above once a result of dividing a cycle of the clock signal by the time delay of the single latch.

In one embodiment, M is greater than or equal to 1.5 times the result of dividing the cycle of the clock signal by the time delay of the single latch.

In one embodiment, the N latch chains in the power supply voltage detector are enabled at the rising edge of the clock signal, and output data and are reset at the falling edge of the clock signal; or, the power supply voltage detector further comprises other N latch chains with the same structure as the N latch chains and other N buffers, and enables the N latch chains at the rising edge of the clock signal and outputs data and resets at the falling edge of the clock signal.

And the power supply voltage detector enables the other N latch chains at the falling edge of the clock signal, and outputs data and resets at the rising edge of the clock signal.

According to one or more embodiments of the present disclosure, it is provided a computer readable medium, on which a computer program is stored, wherein the program, when executed by a processor, implements the power supply voltage detection method of the present disclosure.

The block diagrams of means, apparatuses, devices and systems involved in this disclosure are only illustrative examples and are not intended to require or imply that they should be connected, arranged and configured in the manner shown in the block diagrams. As those skilled in the art will realize, these means, apparatuses, devices, systems may be connected, arranged and configured in any way. Words such as "comprising", "including" and "having" are open words, which mean "comprising but not limited to" and may be used interchangeably with each other. The words "or" and "and" used here refer to "and/or" and may be used interchangeably with each other unless otherwise indicated clearly in the context. The word "such as" used here refers to the phrase "such as but not limited to" and may be used interchangeably with each other.

The flow chart of steps in this disclosure and the above method descriptions are only illustrative examples and are not intended to require or imply that the steps of various embodiments should be carried out in the given order. As those skilled in the art will realize, the steps in the above embodiments may be performed in any order. Words such as "after", "then", "next" and so on are not intended to limit the order of steps; these words are only used to guide readers through the descriptions of these methods. In addition, any reference to a singular element, such as the article "a", "an" or "the", is not to be interpreted as limiting the element to the singular.

In addition, the steps and apparatuses in various embodiments herein are not limited to be implemented in one embodiment. In fact, some related steps and apparatuses in various embodiments herein may be combined according to the concepts of this disclosure to conceive new embodiments, and these new embodiments are also included in the scope of this disclosure.

Each operation of the above-described methods may be performed by any suitable means capable of performing the corresponding functions. The means may comprise various hardware and/or software components and/or modules, comprising but not limited to a hardware circuit, an Application Specific Integrated Circuit (ASIC) or a processor.

Various illustrative logic blocks, modules, and circuits may be implemented or described with a general-purpose processor, a Digital Signal Processor (DSP), an ASIC, a Field Programmable Gate Array signal (FPGA) or other Programmable Logic Device (PLD), a discrete gate or a transistor logic, a discrete hardware component, or any combination thereof, which is designed for the functions described herein. The general-purpose processor may be a microprocessor, but alternatively, the processor may be any commercially available processor, controller, microcontroller or state machine. The processor may also be implemented as a combination of computing devices, such as a combination of a DSP and a microprocessor, multiple microprocessors, microprocessors cooperating with a DSP core, or any other such a configuration.

The steps of the methods or algorithms described in connection with this disclosure may be directly embedded in a hardware, a software module executed by a processor, or in a combination of the two. The software module may exist in any form of tangible storage media. Some examples of storage media that can be used comprise a Random Access Memory (RAM), a Read Only Memory (ROM), a flash memory, an EPROM memory, an EEPROM memory, a register, a hard disk, a removable disk, a CD-ROM, etc. The storage medium may be coupled to a processor so that the processor can read information from and write information to the storage medium. In the alternative, the storage medium may be integral with the processor. The software module may be a single instruction or a plurality of instructions, and may be distributed on several different code segments, between different programs and across multiple storage media.

The methods disclosed herein comprise methods and actions for implementing the descriptions. The methods and/or actions may be interchanged with each other without departing from the scope of the claims. In other words, unless a specific order of actions is specified, the order and/or use of specific actions may be modified without departing from the scope of the claims.

The above functions may be implemented by a hardware, a software, a firmware or any combination thereof. If implemented in software, the functions may be stored as instructions on a tangible computer readable medium. The storage medium may be any available tangible medium that can be accessed by a computer. By way of example and not limitation, such a computer readable medium may comprise a RAM, a ROM, an EEPROM, a CD-ROM or other optical disk storage, magnetic disk storage or other magnetic storage means or any other tangible media that can be used to carry or store desired program codes in the form of instructions or data structures and can be accessed by a computer. As used herein, disk and disc comprise a Compact Disk (CD), a laser disk, an optical disk, a Digital Versatile Disk (DVD), a floppy disk and a Blu-ray disk, wherein disks usually reproduce data magnetically, while discs reproduce data optically with laser.

Therefore, a computer program product can perform the operations given here. For example, such a computer program product may be a computer-readable tangible medium having instructions tangibly stored (and/or encoded) thereon, which may be executed by a processor to perform the operations described herein. The computer program product may comprise package materials.

The software or instructions may also be transmitted through a transmission medium. For example, the software may be transmitted from a website, a server or other remote sources through transmission media such as a coaxial cable, a fiber optic cable, a twisted-pair cable, a Digital Subscriber Line (DSL) or wireless technologies such as an infrared ray, radio or microwave.

In addition, the modules and/or other appropriate means for performing the methods and techniques described herein may be downloaded and/or obtained by other means by a user terminal and/or a base station when appropriate. For example, such a device may be coupled to a server to facilitate the transmission of means for performing the methods described herein. Alternatively, the various methods described herein may be provided via storage components (e.g., a RAM, a ROM, a physical storage medium such as a CD or a floppy disk, etc.), so that the user terminal and/or the base station can obtain various methods when coupled to the device or providing storage components to the device. In addition, any other suitable technologies for providing the methods and technologies described herein to the device may be utilized.

Other examples and implementations are within the scope and spirit of this disclosure and the appended claims. For example, due to the nature of software, the functions described above may be implemented by using a software executed by a processor, a hardware, a firmware, a hard wiring, or any combination thereof. Features that implement the functions may also be physically located at various locations, such as being distributed so that different parts of the functions are implemented at different physical locations. Furthermore, as used herein in the claims, "or" used in enumeration of items starting with "at least one" indicates separate enumeration, so that for example, the enumeration of "at least one of A, B or C" means A or B or C, or AB or AC or BC, or ABC (i.e. A and B and C). Furthermore, the word "exemplary" does not mean that the described example is preferred or better than other examples.

Various changes, substitutions and alterations may be made to the technologies described herein without departing from the technologies taught by the appended claims. Furthermore, the scope of the claims of the present disclosure is not limited to the specific aspects of the above-described processes, machines, manufacturing, composition of events, means, methods and actions. It is possible to utilize the processes, machines, manufacturing, composition of events, means, methods or actions that are currently existing or will be developed later and that can perform basically the same functions or achieve basically the same results with those of the corresponding aspects described herein. Therefore, the appended claims comprise such processes, machines, manufacturing, compositions of events, means, methods or actions within the scope of the claims.

The above description of the disclosed aspects is provided to enable any person skilled in the art to make or use the disclosure. Various modifications to these aspects are very obvious to those skilled in the art, and general principles defined herein may be applied to other aspects without departing from the scope of this disclosure. Therefore, the present disclosure is not intended to be limited to the aspects shown herein, but to the widest scope consistent with the principles and novel features disclosed herein.

The above descriptions have been given for the purpose of illustration and description. Furthermore, this description is not intended to limit the embodiments of the present disclosure to the forms disclosed herein. Although a number of example aspects and embodiments have been discussed above, those skilled in the art will recognize some variations, modifications, changes, additions and subcombinations thereof.

What is claimed is:

1. A power supply voltage detection apparatus connected to an integrated circuit power supply network, comprising:
    a power supply voltage detector, comprising:
        a buffer string, comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; and
        N latch chains, each of which comprises M latches, wherein a clock input terminal of each latch is connected to the clock signal, a data input terminal of a first latch of each latch chain is connected to the output terminal of a corresponding buffer among the N buffers, a data output terminal of the first latch is connected to a data input terminal of a second latch, and a data output terminal of the $m^{th}$ latch is connected to a data input terminal of the $(m+1)^{th}$ latch, wherein M and m are positive integers, M is greater than or equal to 2, m is greater than 1 and less than M, a power supply input VDD terminal of each latch is connected to an area in the integrated circuit power supply network where a power supply voltage is to be detected, and a grounding terminal of each latch is connected to a ground; and
    a voltage regulation module connected to the data output terminal of each latch of each latch chain and configured to detect data output of each latch to determine a magnitude of a power supply voltage in the area in the integrated circuit power supply network where the power supply voltage is to be detected.

2. The power supply voltage detection apparatus according to claim 1,
    wherein the voltage regulation module is configured to:
        obtain a logical value string of each latch chain through logical values obtained according to comparison between the data output of each latch and a reference level; and
        determine the magnitude of the power supply voltage of the area in the integrated circuit power supply network where the power supply voltage is to be detected according to the logical value strings of the N latch chains and a relationship between values of the logical value strings of the N latch chains and the magnitude of the power supply voltage;
    or
    the voltage regulation module is configured to:
        obtain the logical value string of each latch chain through the logical values obtained according to the comparison between the data output of each latch and the reference level;
        obtain time delay ranges of latches of each of the plurality of latch chains according to the logical value strings of a plurality of latch chains and a time length of a high level of the clock signal;
        obtain an actual delay range of a single latch according to the time delay ranges of the latches of each of the plurality of latch chains; and
        determine the magnitude of the power supply voltage of the area in the integrated circuit power supply network where the power supply voltage is to be detected according to the relationship between the actual time delay range of the single latch and the magnitude of the power supply voltage.

3. The power supply voltage detection apparatus according to claim 2, wherein if the data output of the latch is higher than the reference level, then the logic value is a first value, and if the data output of the latch is lower than the reference level, then the logic value is a second value;
    the voltage regulation module is configured to obtain the time delay ranges of the latches of each of the plurality of latch chains according to the logic value strings of the plurality of latch chains and the time length of the high level in the clock signal through the following steps:
        determining a number of the first values in the logical value string of a predetermined latch chain;
        determining a number of buffers between the predetermined latch chain and the input clock signal;
        determining that the time length of the high level in the clock signal is greater than a sum of a product of the number of the buffers and a time delay of a single buffer and a product of the number of the first values and a time delay of a single latch, and less than a sum of a product of the number of buffers before the latch chain and the time delay of the single buffer and a product of a result of the number of the first values plus 1 and the time delay of the single latch; and calculating an actual time delay range of the single latch.

4. The power supply voltage detection apparatus according to claim 2, wherein the voltage regulation module is configured to:

increase the power supply voltage to compensate for voltage sag when the determined power supply voltage is lower than a predetermined voltage, or decrease the power supply voltage to compensate for voltage rise when the determined power supply voltage is higher than the predetermined voltage, according to the magnitude of the determined power supply voltage.

5. The power supply voltage detection apparatus according to claim 2, wherein the relationship between the actual time delay range of the single latch and the magnitude of the power supply voltage is obtained through experimental measurement, or the relationship between the values of the logical value strings of N latch chains and the magnitude of the power supply voltage is obtained through experimental measurement.

6. The power supply voltage detection apparatus according to claim 1, wherein N is a number obtained by rounding up a result of dividing the time delay of a single latch by the time delay of a single buffer.

7. The power supply voltage detection apparatus according to claim 1, wherein M is greater than or equal to a value above a result of dividing a cycle of the clock signal by the time delay of a single latch.

8. The power supply voltage detection apparatus according to claim 1, wherein M is greater than or equal to 1.5 times the result of dividing the cycle of the clock signal by the time delay of a single latch.

9. The power supply voltage detection apparatus according to claim 1, wherein, the N latch chains in the power supply voltage detector are enabled at a rising edge of the clock signal, and output data and reset at a falling edge of the clock signal; or the power supply voltage detector also comprises other N latch chains with a same structure as the N latch chains and other N buffers, and the N latch chains are enabled at the rising edge of the clock signal and output data and reset at the falling edge of the clock signal, and the other N latch chains are enabled at the falling edge of the clock signal and output data and reset at the rising edge of the clock signal.

10. A power supply voltage detection system, comprising:

a plurality of power supply voltage detection apparatuses according to claim 1 connected to a plurality of areas of an integrated circuit power supply network.

11. A power supply voltage detector, comprising:

a buffer string, comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N;

N latch chains, each of which comprises M latches, wherein a clock input terminal of each latch is connected to the clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, M is greater than or equal to 2, m is greater than 1 and less than M, a power supply input VDD terminal of each latch is connected to an area in an integrated circuit power supply network where a power supply voltage is to be detected, and a grounding terminal of each latch is connected to a ground.

12. A power supply voltage detection method, comprising:

providing a power supply voltage detector which comprises:

a buffer string, comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; and N latch chains, each of which comprises M latches, wherein a clock input terminal of each latch is connected to the clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, M is greater than or equal to 2, m is greater than 1 and less than M, a power supply input VDD terminal of each latch is connected to an area in an integrated circuit power supply network where a power supply voltage is to be detected, and a grounding terminal of each latch is connected to a ground; and detecting data output of each latch to determine a magnitude of a power supply voltage of the area in the integrated circuit power supply network where the power supply voltage is to be detected.

13. A computer readable medium on which a computer program is stored, wherein the program, when executed by a processor, implements a power supply voltage detection method comprising:

providing a power supply voltage detector which comprises:

a buffer string, comprising N buffers, wherein an input terminal of a first buffer is connected to a clock signal, an output terminal of the first buffer is connected to an input terminal of a second buffer, and an output terminal of an $n^{th}$ buffer is connected to an input terminal of an $(n+1)^{th}$ buffer, wherein N and n are positive integers, and n is greater than 1 and less than N; and N latch chains, each of which comprises M latches, wherein a clock input terminal of each latch is connected to the clock signal, a data input terminal of a first latch of each latch chain is connected to the output terminal of a corresponding buffer among the N buffers, a data output terminal of the first latch is connected to a data input terminal of a second latch, the data output terminal of an $m^{th}$ latch is connected to the data input terminal of an $(m+1)^{th}$ latch, wherein M and m are positive integers, M is greater than or equal to 2, m is greater than 1 and less than M, a power supply input VDD terminal of each latch is connected to an area in an integrated circuit power supply network where a power supply voltage is to be detected, and a grounding terminal of each latch is connected to a ground; and detecting data output of each latch to determine a magnitude of a power supply voltage of the area in the integrated circuit power supply network where the power supply voltage is to be detected.

* * * * *